(12) United States Patent
Huynh et al.

(10) Patent No.: US 9,093,442 B1
(45) Date of Patent: Jul. 28, 2015

(54) APPARATUS AND METHOD FOR ACHIEVING WIDEBAND RF PERFORMANCE AND LOW JUNCTION TO CASE THERMAL RESISTANCE IN NON-FLIP BUMP RFIC CONFIGURATION

(71) Applicant: Lockheed Martin Corporation, Bethesda, MD (US)

(72) Inventors: Duc Huynh, Princeton Junction, NJ (US); Wilbur Lew, Mount Laurel, NJ (US)

(73) Assignee: Lockheed Martin Corporation, Bethesda, MD (US)

( * ) Notice: Subject to any disclaimer, the term of this patent is extended or adjusted under 35 U.S.C. 154(b) by 0 days.

(21) Appl. No.: 14/214,124

(22) Filed: Mar. 14, 2014

Related U.S. Application Data

(60) Provisional application No. 61/790,706, filed on Mar. 15, 2013.

(51) Int. Cl.
| | |
|---|---|
| *H01L 23/34* | (2006.01) |
| *H01L 23/552* | (2006.01) |
| *H01L 23/498* | (2006.01) |
| *H01L 23/367* | (2006.01) |
| *H01L 23/00* | (2006.01) |

(52) U.S. Cl.
CPC ........ *H01L 23/49838* (2013.01); *H01L 23/367* (2013.01); *H01L 24/97* (2013.01)

(58) Field of Classification Search
CPC .. H01L 23/49836; H01L 23/367; H01L 24/97
USPC .................................................. 257/728, 660
See application file for complete search history.

(56) References Cited

U.S. PATENT DOCUMENTS

| | | | |
|---|---|---|---|
| 3,984,620 A | 10/1976 | Robillard et al. | |
| 5,497,033 A | 3/1996 | Fillion et al. | |
| 7,863,762 B2 | 1/2011 | Sheats | |
| 2002/0036100 A1 | 3/2002 | Slemmons et al. | |
| 2013/0256849 A1* | 10/2013 | Danny et al. | 257/664 |

* cited by examiner

*Primary Examiner* — Luan C Thai
(74) *Attorney, Agent, or Firm* — Howard IP Law Group, PC

(57) ABSTRACT

An integrated circuit package is provided. The package includes a housing on which at least one semiconductor device is mounted, active side up. A substrate having a transmission line formed on or within a first dielectric layer thereof is provided. The transmission line is arranged between the active side of the semiconductor device and at least one input or output port of the package for providing an electrical connection therebetween.

17 Claims, 5 Drawing Sheets

APPARATUS AND METHOD FOR ACHIEVING WIDEBAND RF PERFORMANCE AND LOW JUNCTION TO CASE THERMAL RESISTANCE IN NON-FLIP BUMP RFIC CONFIGURATION

CROSS-REFERENCE TO RELATED APPLICATION

This application claims the benefit of U.S. Provisional Patent Application No. 61/790,706, filed Mar. 15, 2013, the entire disclosure of which is incorporated by reference herein for all purposes.

FIELD OF THE INVENTION

The present disclosure relates generally to integrated circuit and semiconductor packaging, and more specifically, to packaging systems and methods offering improved electrical and thermal performance of integrated circuits and other semiconductor devices.

BACKGROUND

Technical challenges in the design of integrated circuits, such as monolithic microwave integrated circuit (MMIC) modules, include minimizing return loss, especially when operating over a wide bandwidth and at high frequencies. Moreover, excessive heat generation in these radio frequency (RF) applications can be a limiting factor in both the performance and longevity of a device. In fact, achieving suitable performance in an MMIC module design with a return loss performance of 15 dB or better over a wide bandwidth (i.e. greater than an octave bandwidth) at high frequency (e.g. Ku-band and higher), while retaining a thermal path to channel heat from the MMIC device, has proven to be impossible using ribbon or bond-wire techniques to connect an MMIC to a connectorized substrate or package housing.

More specifically, a common technique for designing an active MMIC module for a transmit/receive or multiple input/output port switch matrix application is to bond an MMIC device with its active side up onto a module substrate or package. Once bonded, direct current (DC) and RF interconnections between the MMIC and module package are made using conductive ribbons or bond wires. An exemplary package resulting from this process is shown in FIG. 1. Package 10 includes an MMIC 12 mounted to a cold plate 14. Electrical connections (e.g. RF connections) are made by bond wires 16 arranged between a top active surface of MMIC 12 and, for example, RF ports or terminals 17 of package 10. In this implementation, the use of ribbons or bond wires introduce randomly-variable inductances which limit return loss performance over a wide bandwidth at high frequency.

In addition, matching and tuning techniques, such as matching networks 18, are typically needed to attempt to account for the inductances created by the wire bonding. However, these networks typically add additional insertion loss, in addition to requiring significant surface area that increases overall package size and complexity. Further still, as the inductances are often varying over frequency, it is difficult to design a matching network which remains effective over a wide bandwidth at high frequency.

In order to minimize these inductance variations, alternative packaging methods have been developed. For example, "flip chip" arrangements include MMIC devices mounted upside-down, using solder bumps to make the electrical connections between the active surface of the MMIC to the module package. An exemplary arrangement is illustrated in FIG. 2, wherein package 20 includes an inverted MMIC 22 which is mounted to a corresponding pad formed on surface 24 of package 20 via solder bumps 28. However, such a soldered configuration results in the formation of a gap 26, wherein MMIC 22 is suspended over packaging mounting surface 24. This gap may comprise an air gap, or may be filled with an adhesive or epoxy. The implementation of solder bumps yields excellent return loss performance (15 dB or greater) over a wide bandwidth at high frequency. However, these arrangements lack a viable thermal path to cool the MMIC, as there is no direct contact to any metallic surface (e.g. to a cold plate). Moreover, it is quite difficult to align all DC and RF pads to corresponding solder bumps on a complex active MMIC, including those with multiple input/output ports.

Alternative structures and methods of mounting active semiconductor devices are desired.

SUMMARY

In one embodiment of the present disclosure, a method of packaging or interconnecting RF integrated circuits is provided. The method includes placing an RF integrated circuit or semiconductor device active side up onto a package substrate or a cold plate. An electrical interconnection is created between the active side of the semiconductor device and an associated RF input or output port or terminal of the package with a transmission line formed on or within a dielectric substrate (e.g. a printed circuit board).

In another embodiment, an integrated circuit package is provided. The package includes a package housing, and at least one active semiconductor device mounted to a portion of the housing, active side up. An electrical input or output port or junction of the package is connected to the active side of the semiconductor via a transmission line formed on or within a first dielectric layer of a substrate.

DETAILED DESCRIPTION

Figure 1:
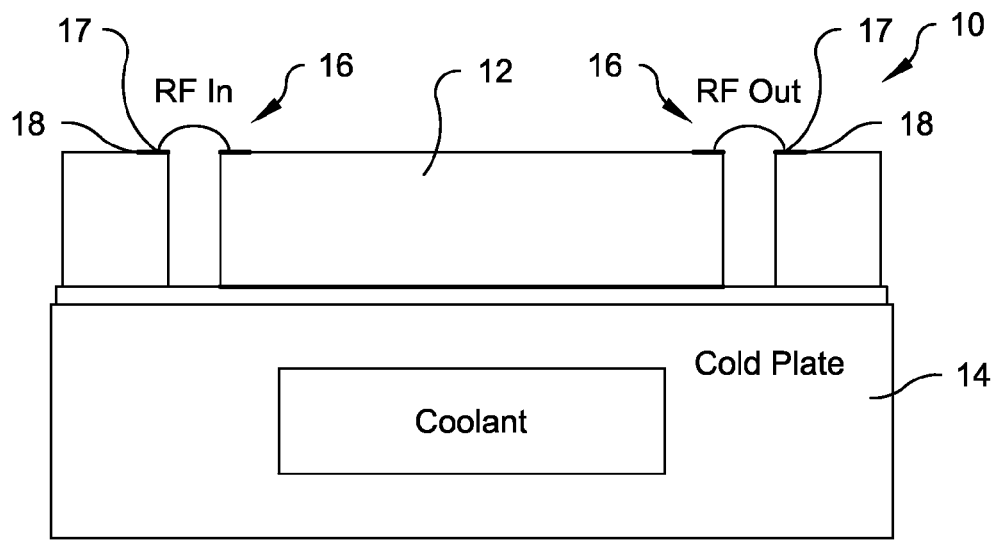
FIG. 1 is a simplified perspective view of a semiconductor package including a single MMIC operatively connected to a module or package housing via conventional wire bonding methods.
Figure 2:
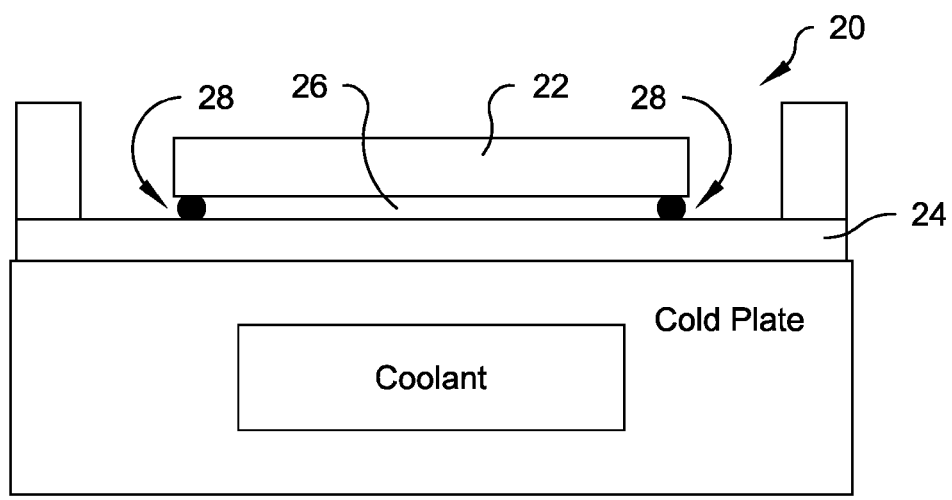
FIG. 2 is a simplified perspective view of a semiconductor package including a single MMIC operatively connected to a module or package housing via conventional flip chip soldering methods.

It is to be understood that the figures and descriptions of the present invention have been simplified to illustrate elements that are relevant for a clear understanding of the present invention, while eliminating, for purposes of clarity, many other elements found in integrated circuits, including MMICs, as well as elements found in laminated printed circuit board (PCB) arrangements. However, because such elements are well known in the art, and because they do not facilitate a better understanding of the present invention, a discussion of such elements is not provided herein. The disclosure herein is directed to all such variations and modifications known to those skilled in the art.

In the following detailed description, reference is made to the accompanying drawings that show, by way of illustration, specific embodiments in which the invention may be practiced. It is to be understood that the various embodiments of the invention, although different, are not necessarily mutually exclusive. Furthermore, a particular feature, structure, or characteristic described herein in connection with one embodiment may be implemented within other embodiments without departing from the scope of the invention. In addition, it is to be understood that the location or arrangement of individual elements within each disclosed embodiment may be modified without departing from the scope of the invention. The following detailed description is, therefore, not to be taken in a limiting sense, and the scope of the present invention is defined only by the appended claims, appropriately interpreted, along with the full range of equivalents to which the claims are entitled. In the drawings, like numerals refer to the same or similar functionality throughout several views.

Embodiments of the present disclosure include improved semiconductor packaging techniques which offer the advantages of a direct thermal path between chip and package, as well as low inductance/low loss operative connections. As set forth above, current RF module or package fabrication techniques do not simultaneously achieve low thermal junction resistance and RF return loss better than 15 dB over a wide operating band (10 MHz to 45 GHz).

In one embodiment, the disclosure provides a unique packaging concept for mounting an MMIC or other semiconductor device to a connectorized substrate or package housing that yields excellent return loss (15 dB or greater) over a wide bandwidth at high frequency, as well as provides an efficient thermal path to cool the MMIC device. In one embodiment, an RF semiconductor is mounted onto a module substrate, active side up, using a highly thermal conductive material (e.g. preformed solder, conductive epoxy, or the like) or brazed or bonded to a metallic shim (carrier) with a thermal conductive material. This assembly is then mounted into or onto a package or housing which contains electrical connectors or junctions (e.g. a microstrip or grounded co-planer waveguide), ensuring the lowest possible junction-to-case resistance. In one embodiment, the assembly may be mounted to a cold plate which includes internal coolant passages running therethrough for continuously carrying heat away from MMIC. In place of, for example, conventional wire bonding or ribbon connections utilized by the prior art, embodiments of the present disclosure employ suspended transmission lines and solder bumped semiconductors to form the interconnections between the active side of the MMIC and the package connections. The transmission line, such as a grounded coplanar waveguide (CPWG), may be designed and fabricated on any dielectric substrate. In this way, these connecting structures may be embodied as PCBs arranged between an active semiconductor device and a corresponding electrical port or junction of the package.

Figure 3:
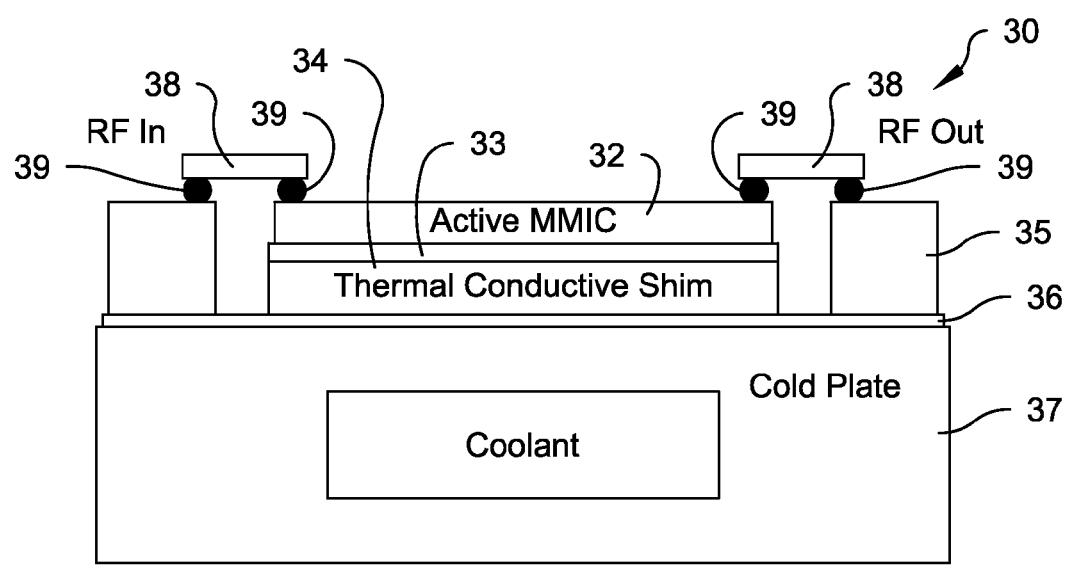
FIG. 3 is a simplified perspective view of a semiconductor package according to embodiments of the present disclosure.

Referring generally to FIG. 3, an embodiment of the present disclosure is shown. Package 30 includes an active RF semiconductor device, such as MMIC 32. MMIC 32 may be mounted to a thermally conductive shim 34 via a highly thermal conductive material 33 (such as preformed solder, conductive epoxy, etc). Shim 34 may in turn be mounted to a cold plate 37 (or to a package substrate or mounting surface) via conductive material 36 to ensure an efficient heat path with cold plate 37. Solder bumps 39 are formed on both MMIC 32 and package structure 35 (e.g. on signal and/or ground bonding pads or electrical junctions of the MMIC and package structure). The interconnections between MMIC 32 and package structure 35 are made, for example, through transmission lines formed on or within substrates (e.g. dielectric material), embodied herein as PCBs 38. As will be understood by one of ordinary skill in the art, a PCB is a composite structure comprising one or more dielectric material layers having a metal (e.g. copper) laminate bonded thereto. The metal laminate is patterned, forming conductive traces or transmission lines (e.g. striplines, waveguides, etc.) for carrying electrical signals between various locations on the board. As will be set forth in greater detail below, an exemplary transmission line of PCB 38 may comprise, for example, a CPWG formed on a surface of PCB 38 in a conventional way. PCB 38 may then be inverted from a conventional orientation, and the transmission line(s) thereof attached to solder bumps 39 for forming desired interconnections as illustrated.

Figure 4A:
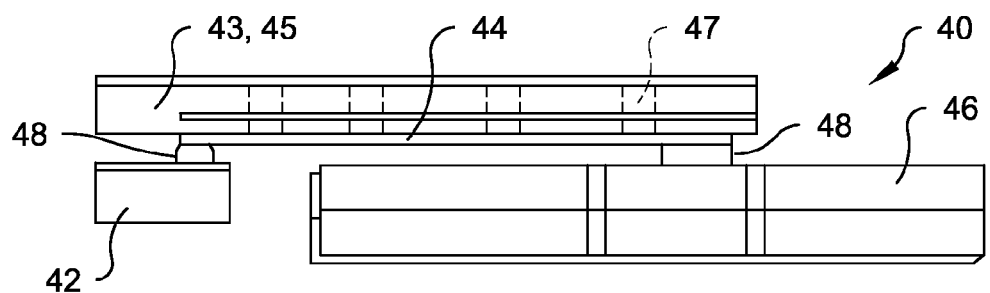
FIG. 4A is a simplified side perspective view of a semiconductor package according to embodiments of the present disclosure.
Figure 4B:
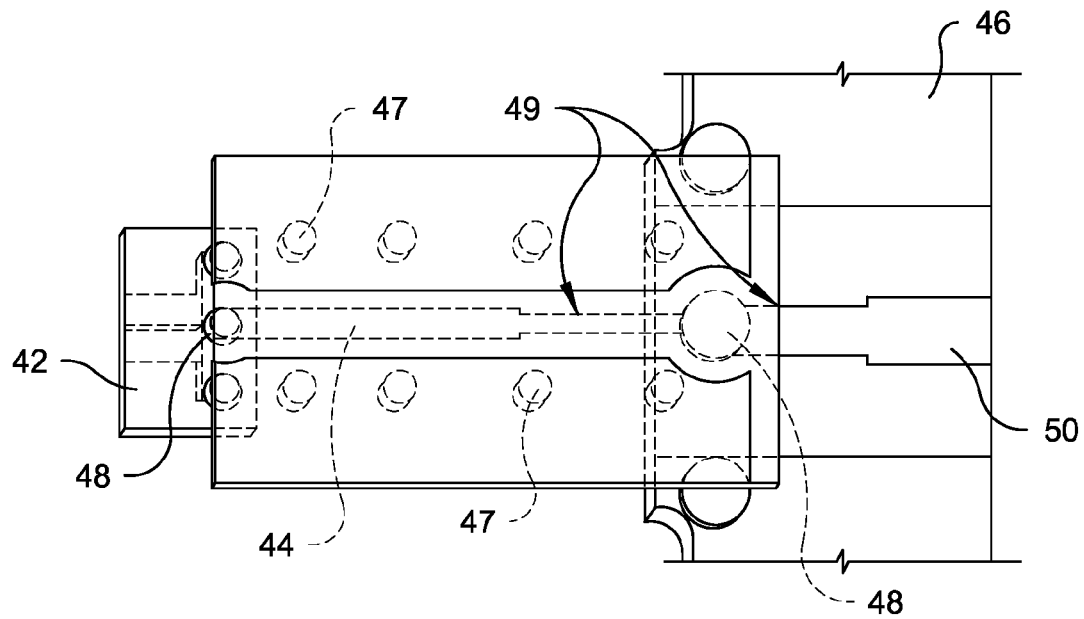
FIG. 4B is a simplified top perspective view of the semiconductor package of FIG. 4A.

FIGS. 4A and 4B illustrate another exemplary embodiment of an interconnection method according to the present disclosure. Package 40 includes an active semiconductor device, such as RF MMIC 42 connected to package housing 46 via a transmission line structure 43. Structure 43 includes at least one dielectric substrate layer 45, with a CPWG 44 formed (e.g. etched) in a first metalized layer or surface thereof. In this way, structure 43 may comprise a PCB having a conventional CPWG 44 formed thereon, which is subsequently inverted such that CPWG 44 is placed into direct contact with solder bumps 48. In an alternate embodiment of the present disclosure, conductive (e.g. metalized) vias may be formed through one or more of the dielectric layers of structure 43 and used to electrically connect the ends of CPWG 44 (or ends of a stripline embedded within structure 43) to MMIC 42 and package housing 46. In this way, structure 43 does not need to be inverted prior to installation. As illustrated, structure 43 also may include a plurality of metalized vias 47 arranged adjacent to, and generally along the length of, CPWG 44, forming an isolating ground "via fence".

As set forth above, prior art techniques require matching networks formed on, for example, the module package proximate the wire bonding connection locations. These arrangements require additional surface area, thus increasing the overall package size. Still referring to FIGS. 4A and 4B, according to an embodiment of the disclosure, matching networks may be incorporated or integrated into the transmission lines used to form the electrical interconnections described herein. In the illustrated embodiment, matching network 49, which may include changes in transmission line dimensions (e.g. width and/or depth) as well as substrate and/or ground plane dimensions/orientations, is integrated into CPWG 44 to achieve a desired RF matching characteristic impedance with, for example, RF transmission lines/connectors 50 of package housing 46. In this way, interconnections according to embodiments of the present disclosure provide an integrated tuning function absent from wire bonds or ribbon connections of the prior art. Further, as a result of these integral matching networks, overall package size may be significantly reduced compared to arrangements of the prior art.

Figure 5:
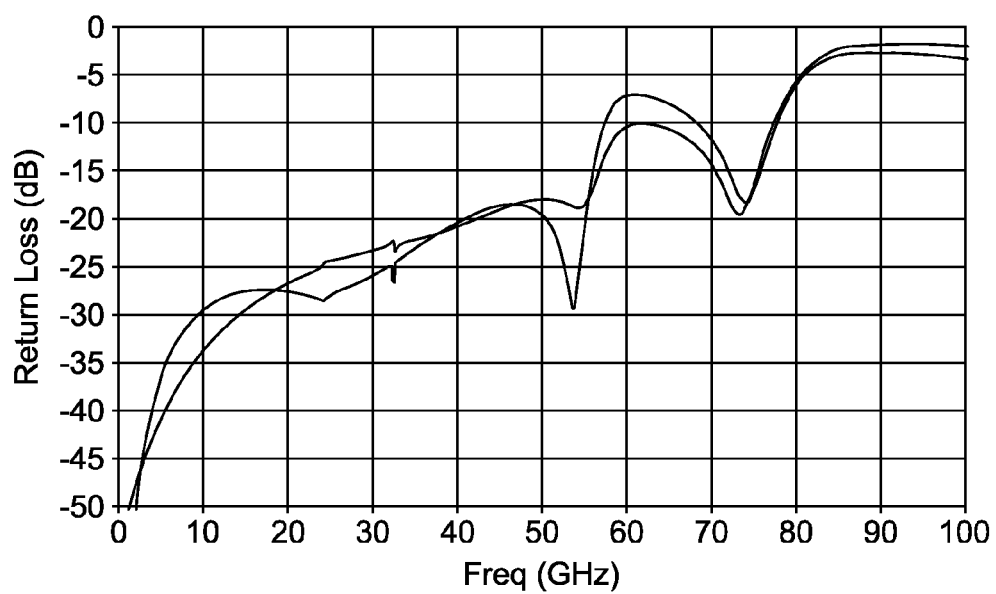
FIG. 5 is a graphical representation illustrating the improved return loss performance of semiconductor packages according to embodiments of the present disclosure.

Referring generally to FIG. 5, High Frequency Simulation Solver (HFSS) results are shown for the arrangement of FIGS. 4A and 4B. As illustrated, return loss performance of better than 15 dB over an extremely broad bandwidth (e.g.

MHz to 50 GHz) is achieved for the illustrated embodiment compared to the return loss performance of the prior art.

Figure 6:
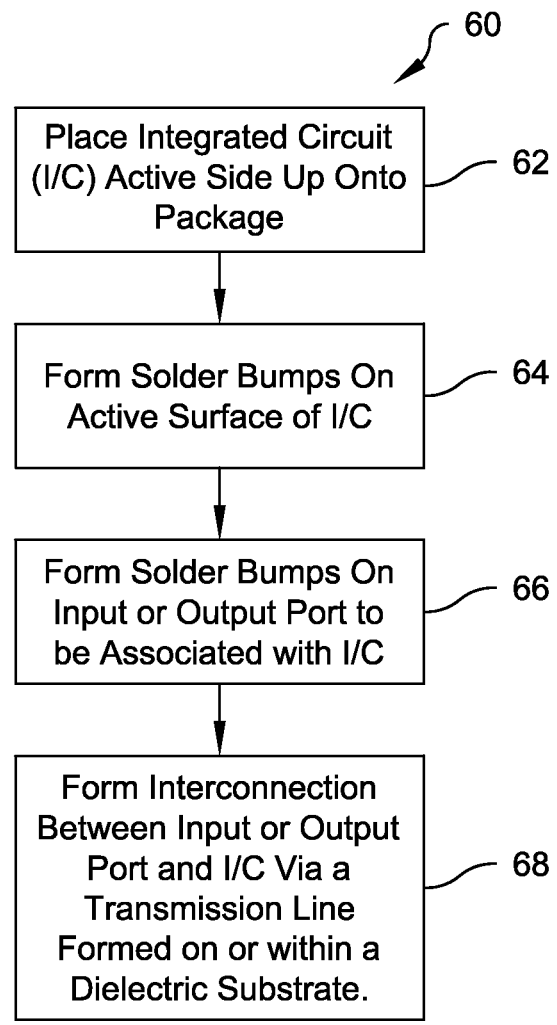
FIG. 6 is diagram of an exemplary process for manufacturing an embodiment of the present disclosure.

FIG. 6 illustrates an exemplary process 60 for manufacturing embodiments of the present disclosure. In step 62, an integrated circuit, such as the above-described MMIC device is place active side up onto a package mounting surface or a cold plate. This step may include the placement of a thermally conductive shim between the integrated circuit or device and the package mounting surface. In this way, direct contact between a major surface of the device (or shim) and the package (or cold plate) is achieved, promoting improved device cooling. In steps 64 and 66, solder bumps are formed on the active side of the device (e.g. a bonding pad), as well as on an electrical junction or port of the package (e.g. a bonding pad) to be associated with the device. Finally, in step 68, an interconnection between the device and the junction is made by a transmission line formed on or within a dielectric substrate (e.g. a CPWG of a PCB). As set forth above, in one embodiment, this interconnection may be formed by inverting a PCB such that one or more transmission lines formed thereon face downward, and placing the one or more transmission lines into contact with corresponding solder bumps formed on the device and the connection junction or point of the package. Once aligned, known soldering processes may be used to complete the electrical interconnection.

While the exemplary dielectric substrate described herein includes a CPWG formed thereon, it should be understood that any type of transmission line arrangement may be implemented without departing from the scope of the present disclosure. For example, one or more micro-strip transmission lines and/or embedded stripline arrangements may be used to provide the device-to-package interconnections. Embodiments may include single or multi-layer dielectric or PCB structures, depending on, for example, the number and type of transmission line(s) being utilized, as well as desired tuning and isolation characteristics. Any suitable fabrication techniques and features may be employed for making these connections.

Embodiments of the present disclosure may make other DC and logic interconnections in a conventional wire bonding manner. Likewise, these connections may be made with similar PCB structures as described above with respect to the RF interconnections. In some embodiments, these connections may be made in the same PCB (i.e. a PCB having multiple transmission lines formed thereon/therein) for each connection, or made with separate, discrete PCB arrangements.

Active devices of the present disclosure may include devices with a single input/output port or multiple input/output ports. For multi-port devices, it should be understood that multiple transmission lines may be formed on or within one dielectric substrate or PCB. In this way, multiple connections may be achieved with a single PCB. Likewise, a plurality of discrete substrate/transmission line connections may be provided for forming each interconnection.

While embodiments of the present disclosure have generally been shown and described herein as connecting a semiconductor device to a package housing, it should be understood that embodiments of the present disclosure may also be used to form any number of connection types without departing from the scope of the present disclosure. For example, connections between various active and passive devices, in any combination, of a given package (or between discrete packages), may be achieved using the above-described methods.

The above-described solutions provide excellent return loss performance over wide bandwidth and improved thermal paths to cool the MMIC by using a combination of a "traditional" mounted MMIC, which allows thermal heat to conduct away from MMIC, and flip chip technology for the RF interconnection that greatly reduces variable inductance. In addition, this technique prevents RF loss as it requires only a short (on order of 0.050 inches in length) impedance matching network to compensate for the solder bump pad on RF semiconductor and module package. Using solder bumps to interconnect semiconductor RF pad (ground-signal-ground) to module RF pad (ground-signal-ground) through a grounded co-planar transmission on a suspended dielectric substrate provides excellent RF performance (better than 15 dB return loss) over extremely wide bandwidth (e.g. from 10 MHz to 50 GHz).

While the foregoing invention has been described with reference to the above-described embodiment, various modifications and changes can be made without departing from the spirit of the invention. Accordingly, all such modifications and changes are considered to be within the scope of the appended claims. Accordingly, the specification and the drawings are to be regarded in an illustrative rather than a restrictive sense. The accompanying drawings that form a part hereof, show by way of illustration, and not of limitation, specific embodiments in which the subject matter may be practiced. The embodiments illustrated are described in sufficient detail to enable those skilled in the art to practice the teachings disclosed herein. Other embodiments may be utilized and derived therefrom, such that structural and logical substitutions and changes may be made without departing from the scope of this disclosure. This Detailed Description, therefore, is not to be taken in a limiting sense, and the scope of various embodiments is defined only by the appended claims, along with the full range of equivalents to which such claims are entitled.

Such embodiments of the inventive subject matter may be referred to herein, individually and/or collectively, by the term "invention" merely for convenience and without intending to voluntarily limit the scope of this application to any single invention or inventive concept if more than one is in fact disclosed. Thus, although specific embodiments have been illustrated and described herein, it should be appreciated that any arrangement calculated to achieve the same purpose may be substituted for the specific embodiments shown. This disclosure is intended to cover any and all adaptations of variations of various embodiments. Combinations of the above embodiments, and other embodiments not specifically described herein, will be apparent to those of skill in the art upon reviewing the above description.

What is claimed is:

1. An integrated circuit package comprising:
   a package housing;
   at least one semiconductor device having an active side, the semiconductor device mounted active side up to a portion of the package housing, the active side adapted for communicating with at least one input or output port; and
   a substrate having a transmission line formed on or within a first dielectric layer thereof, said transmission line comprising a coplanar waveguide,
   wherein the coplanar waveguide transmission line is arranged between the active side of the semiconductor device and the at least one input or output port for providing an electrical connection therebetween.

2. The integrated circuit package of claim 1, wherein the substrate comprises a printed circuit board.

3. The integrated circuit package of claim 1, wherein the coplanar waveguide transmission line is a grounded coplanar waveguide embedded within the first dielectric layer.

4. The integrated circuit package of claim 1, wherein the active side of the semiconductor device and the at least one input or output port are connected to the coplanar waveguide transmission line via solder connections.

5. The integrated circuit package of claim 1, wherein the portion of the package housing on which the semiconductor device is mounted comprises a cold plate.

6. The integrated circuit package of claim 1, further comprising a thermally conductive shim arranged between the package housing and the semiconductor device.

7. A method of interconnecting a semiconductor device within an integrated circuit package comprising:
    placing a semiconductor device onto a mounting surface of a package, the semiconductor device having an active side oriented generally opposite the mounting surface; and
    forming an electrical interconnection between the active side of the semiconductor device and an associated input or output port of the package with at least one transmission line formed on or within a dielectric substrate, said transmission line comprising a coplanar waveguide.

8. The method of claim 7, wherein the dielectric substrate comprises a printed circuit board.

9. The method of claim 7, wherein the step of forming the interconnection includes soldering the coplanar waveguide transmission line to the active side of the semiconductor device and to the associated input or output port of the package.

10. The method of claim 7, further comprising the step of forming solder bumps on the active side of the semiconductor device and the associated input or output port.

11. The method of claim 7, wherein the coplanar waveguide transmission line is a grounded coplanar waveguide embedded within the dielectric substrate.

12. The method of claim 7, wherein the coplanar waveguide transmission line is formed on a side of the substrate facing the active side of the semiconductor device.

13. The method of claim 7, wherein the coplanar waveguide transmission line is formed on a side of the substrate opposite the active side of the semiconductor device.

14. The method of claim 7, further comprising the step of placing a thermally conductive shim between the mounting surface of the package and the semiconductor device.

15. The method of claim 7, further comprising the step of forming a matching network in the coplanar waveguide transmission line for providing impedance matching between the semiconductor device and the input or output port of the package.

16. A semiconductor package including:
    a package having at least one associated input or output electrical junction;
    a semiconductor device having an active side;
    a dielectric substrate arranged between the input or output junction and the active side of the semiconductor device; and
    a transmission line comprising a coplanar waveguide formed on or within a first dielectric layer of the dielectric substrate, the coplanar waveguide transmission line electrically connecting the active side of the semiconductor device to the at least one input or output junction.

17. The semiconductor package of claim 16, further comprising a matching network integrated into the coplanar waveguide transmission line for providing impedance matching between the semiconductor device and at least one input or output junction.

* * * * *